(12) United States Patent
Ishii et al.

(10) Patent No.: US 6,995,373 B2
(45) Date of Patent: Feb. 7, 2006

(54) SEMICONDUCTOR DEVICE, RADIATION DETECTION DEVICE, AND RADIATION DETECTION SYSTEM

(75) Inventors: Takamasa Ishii, Kanagawa (JP); Chiori Mochizuki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/071,245

(22) Filed: Mar. 4, 2005

(65) Prior Publication Data

US 2005/0145903 A1  Jul. 7, 2005

Related U.S. Application Data

(62) Division of application No. 09/879,214, filed on Jun. 13, 2001, now Pat. No. 6,956,216.

(30) Foreign Application Priority Data

Jun. 15, 2000 (JP) .............................. 2000-180256

(51) Int. Cl.
*H01L 31/062* (2006.01)
*G01T 1/24* (2006.01)

(52) U.S. Cl. ..................... 250/370.08; 250/370.09; 250/370.14; 250/370.11; 257/443; 257/291; 257/431

(58) Field of Classification Search ........... 257/291, 257/443, 431; 250/370.11, 370.14, 370.08
See application file for complete search history.

(56) References Cited

U.S. PATENT DOCUMENTS

| | | | |
|---|---|---|---|
| 5,552,607 A * | 9/1996 | Salisbury et al. ...... 250/370.09 |
| 5,608,245 A | 3/1997 | Martin .................. 257/291 |
| 5,777,335 A | 7/1998 | Mochizuki et al. ..... 250/370.09 |
| 5,869,837 A | 2/1999 | Huang ................ 250/370.09 |
| 5,912,465 A | 6/1999 | Kobayashi et al. ..... 250/370.09 |
| 5,962,856 A | 10/1999 | Zhao et al. ........... 250/370.09 |
| 6,021,173 A | 2/2000 | Brauers et al. .......... 378/98.8 |
| 6,232,606 B1 | 5/2001 | Singh .................. 250/370.09 |
| 6,271,600 B1 * | 8/2001 | Inada ..................... 257/784 |
| 6,429,436 B1 | 8/2002 | Tomisaki et al. ...... 250/370.09 |
| 6,459,132 B1 * | 10/2002 | Mochizuki .............. 257/443 |
| 6,462,344 B1 | 10/2002 | Joo et al. ............. 250/370.09 |
| 6,682,960 B1 | 1/2004 | Mochizuki .............. 438/149 |
| 6,812,494 B2 | 11/2004 | Mochizuki et al. ........ 257/75 |
| 2002/0017666 A1 | 2/2002 | Ishii et al. .............. 257/291 |

* cited by examiner

*Primary Examiner*—Albert Gagliardi
(74) *Attorney, Agent, or Firm*—Fitzpatrick, Cella, Harper & Scinto

(57) ABSTRACT

By forming a redundant circuit of an extra wiring accompanied with no decrease in an aperture ratio for a photoelectric conversion element, the yield is prevented from being reduced due to wire breaking during a panel manufacturing process.

A gate line Vg4 and a Vg redundant wiring are electrically insulated and are arranged so as to form a crossing G of the upper and lower lines. Since a Vg redundant wiring Y is formed concurrently with a Sig line, there is no need for additional manufacturing steps to form the Vg redundant wiring Y. If a breaking occurs in the gate line Vg4, the gate line Vg4 and the Vg redundant wiring Y are electrically connected to each other by irradiating the crossing G with a laser. Therefore, a gate drive pulse is also applied to a thin film transistor on the broken line through the Vg redundant wiring Y. Thus, any lowering in yield due to a breaking of the gate line Vg4 can be prevented without any decrease in the aperture ratio for the photoelectric conversion element.

14 Claims, 14 Drawing Sheets

SEMICONDUCTOR DEVICE, RADIATION DETECTION DEVICE, AND RADIATION DETECTION SYSTEM

This application is a division of application Ser. No. 09/879,214, filed Jun. 13, 2001, now U.S. Pat. No. 6,956,216.

BACKGROUND OF THE INVENTION

1. Related Background Art

The present invention relates to a semiconductor device, and particularly, to a photoelectric conversion device, an area sensor, and a radiation imaging (or image pickup) apparatus having photoelectric conversion elements arranged in a matrix.

FIG. 11 is an equivalent circuit diagram of a prior art photoelectric conversion device.

In FIG. 11, reference numerals P11 to P44 denote semiconductor elements such as photoelectric conversion elements and reference numerals T11 to T44 denote thin film transistors (TFT). As shown in the figure, the gate electrode of each TFT is generally connected to common gate lines Vg1 to Vg4. Each of the gate lines controls the ON/OFF operations of the TFTs.

The source or drain electrode of each TFT is connected to common signal lines Sig1 to Sig4, which are connected to a readout unit. Electric charge generated in the semiconductor elements such as photoelectric conversion elements due to incident visible light or radiation is transferred to the signal lines with gate drive pulses applied by a gate drive unit and is then read out by the readout unit.

FIG. 12 is a plan view of the photoelectric conversion device shown in FIG. 11. As shown in the figure, an additional wiring is provided above the Vg lines as a redundant wiring for Vg lines (Vg redundant wiring) and is joined to the Vg lines through contact holes.

FIG. 13 is a plan view and a sectional view for showing the layer configuration of one pixel in a semiconductor device. The semiconductor device comprises, on an insulating substrate, a semiconductor element such as a photoelectric conversion element, a radiation detection element, or the like which is comprised of a first electrode layer, an insulating layer, a first semiconductor layer, an $n^+$-type semiconductor layer, and a second electrode layer, and a switching TFT which is comprised of a gate electrode layer, a gate insulating layer, a second semiconductor layer, and an ohmic contact layer. Each Vg line is connected to an electrode layer in which the TFT gate electrode is formed and each Sig line is connected to a layer which forms the source/drain electrode.

However, evolution in manufacturing technology for liquid crystal panels using TFTs and increased applicability of area sensors having photoelectric conversion elements to various fields (for example, an X-ray imaging apparatus) have accelerated the development of TFT panels with a larger area. With the enlargement of the area, the pattern pitch becomes finer and finer.

This trend results in lowering of the yield of the panel manufacturing process. Possible causes would be as described below.

Firstly, panels with a larger area have an increased wiring length per panel, which may increase the breaking probability.

Secondly, a finer pattern brings about enlargement of the TFT area or wire crossing area per panel, which may cause a higher probability of short-circuiting between upper and lower metal wirings due to foreign matters.

Thirdly, a larger panel size requires a larger area where a panel is in contact with apparatuses for transporting and handling the panel, and thus, may generate a larger amount of static electricity with a higher probability of generation of defects due to electrostatic destruction (ESD).

The yield may be improved by solving the above-mentioned technical problems and in particular, the breaking problem may be solved with a larger wiring width.

However, a wider wiring may increase the capacitance of a capacitor formed between the upper and lower metal wirings such as a crossing of a Sig line and a Vg line to decrease the sensitivity of a signal to be transferred.

Additionally, if a redundant wiring is formed for each wiring as a remedy for possible breaking, the aperture ratio of a photoelectric conversion element section may decrease with a further decrease in the sensitivity.

As described above, it is very difficult to appropriately design the wiring width, redundant circuit, and so on.

SUMMARY OF THE INVENTION

Therefore, it is an object of the present invention to form a redundant circuit accompanied with no decrease in aperture ratio to prevent the yield from being lowered due to wire breaking during the panel manufacturing process.

In the light of the above mentioned problems, the present invention prevents lowering in a yield of a fabrication process without any decrease in aperture ratio for a photoelectric conversion device, a radiation detection device, or the like.

The above mentioned object is attained by a semiconductor device of the present invention, which comprises a plurality of semiconductor elements, a plurality of switching elements, a plurality of drive lines for driving the switching elements, and a plurality of signal lines for reading out an electric charge detected by the semiconductor elements provided on an insulating substrate, the semiconductor device further comprising a redundant wiring which forms a plurality of crossings with at least one of the drive lines and the signal lines and is electrically insulated from the at least one of the drive lines and the signal lines at each crossing.

DETAILED DESCRIPTION OF THE PREFERRED EMBODIMENTS

Now, embodiments of the present invention will be described in detail with reference to the attached drawings.

[Embodiment 1]

Figure 1:
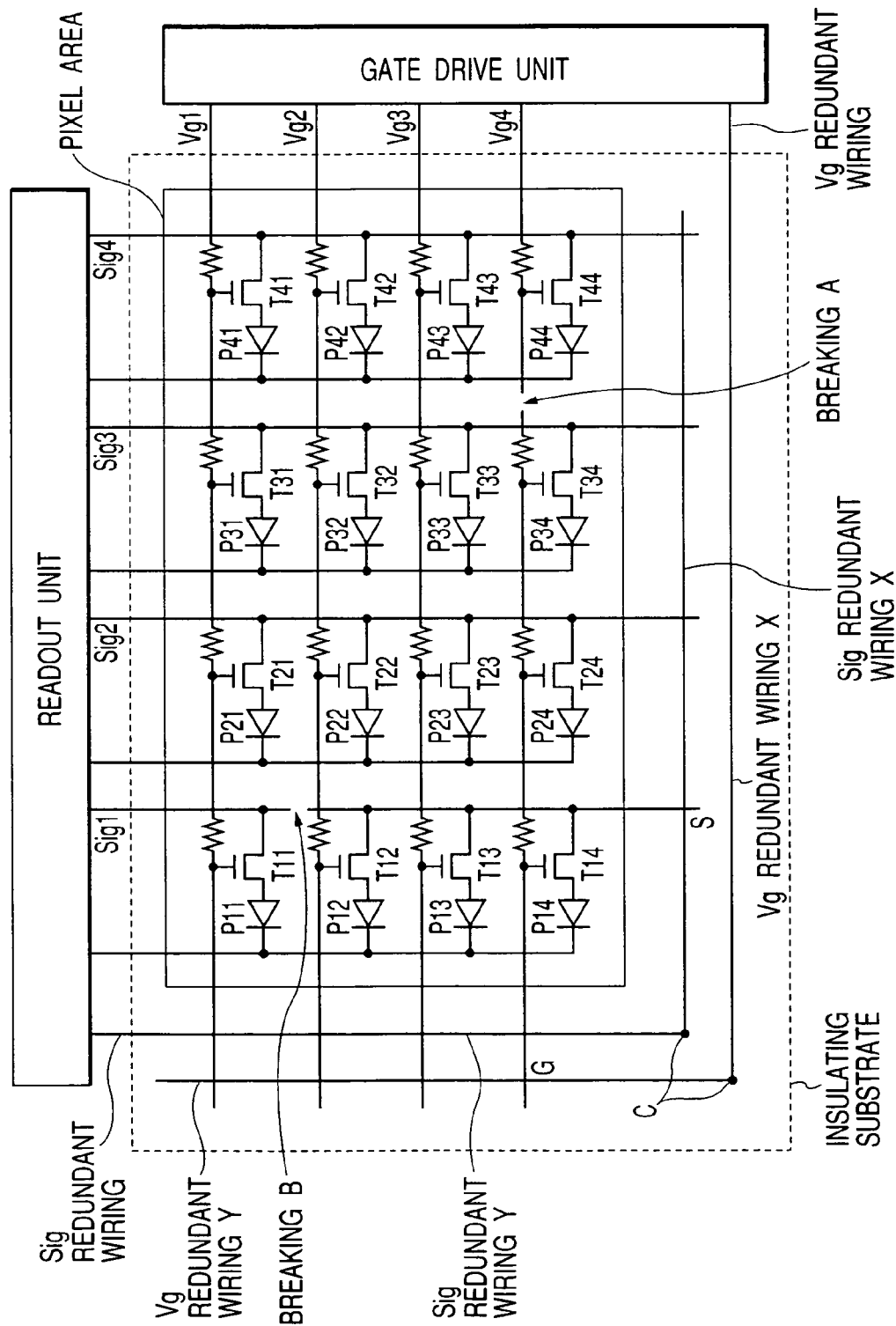
FIG. 1 is an equivalent circuit diagram for showing a first embodiment of the semiconductor device according to the present invention.

FIG. 1 is an equivalent circuit diagram for showing a semiconductor device according to a first embodiment of the present invention.

In FIG. 1, reference numerals P11 to P44 denote semiconductor elements such as photoelectric conversion elements, radiation detection elements or the like and reference numerals T11 to T44 denote switching elements such as TFTs or the like. The gate electrode of each TFT is connected to gate lines Vg1 to Vg4 which are common drive wirings. The gate lines Vg1 to Vg4 are connected to a gate drive unit which controls the ON/OFF operations of the TFTs. The source or drain electrode of each TFT is connected to common signal lines Sig1 to Sig4, which are connected to a readout unit.

In addition, an extra wiring (Vg redundant wiring) connected to the gate drive unit acts as a redundant wiring for the Vg lines and forms a crossing with each Vg line outside a pixel area. Another extra wiring (Sig redundant wiring) connected to the readout unit acts as a redundant wiring for the Sig lines and forms a crossing with each Sig line outside the pixel area.

Here, the Vg redundant wiring consists of a Vg redundant wiring X and a Vg redundant wiring Y and they are joined to each other through a contact hole at a point C in the figure. Also, the Sig redundant wiring consists of a Sig redundant wiring X and a Sig redundant wiring Y and they are joined to each other through a contact hole at the point C in the figure. The above described Vg redundant wiring and Sig redundant wiring are formed outside the pixel area.

A electric charge generated in the semiconductor elements such as photoelectric conversion elements due to incidence of visible light or radiation is transferred to the signal lines with gate drive pulses applied by the gate drive unit and is then read out by the readout unit.

Figure 2:
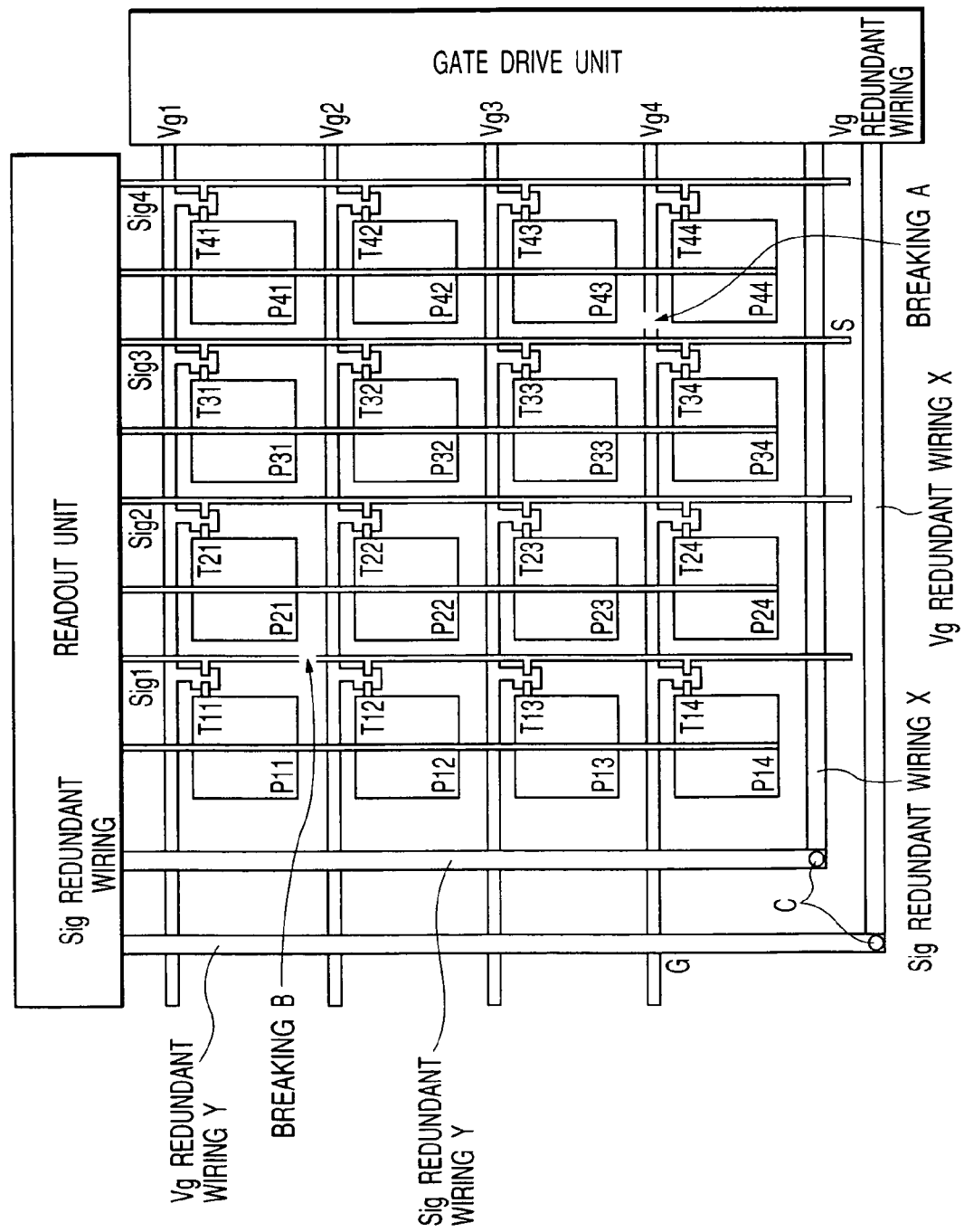
FIG. 2 is a plan view for showing the first embodiment of the semiconductor device according to the present invention.

FIG. 2 is a plan view of the photoelectric conversion device shown in FIG. 1.

Figure 3:
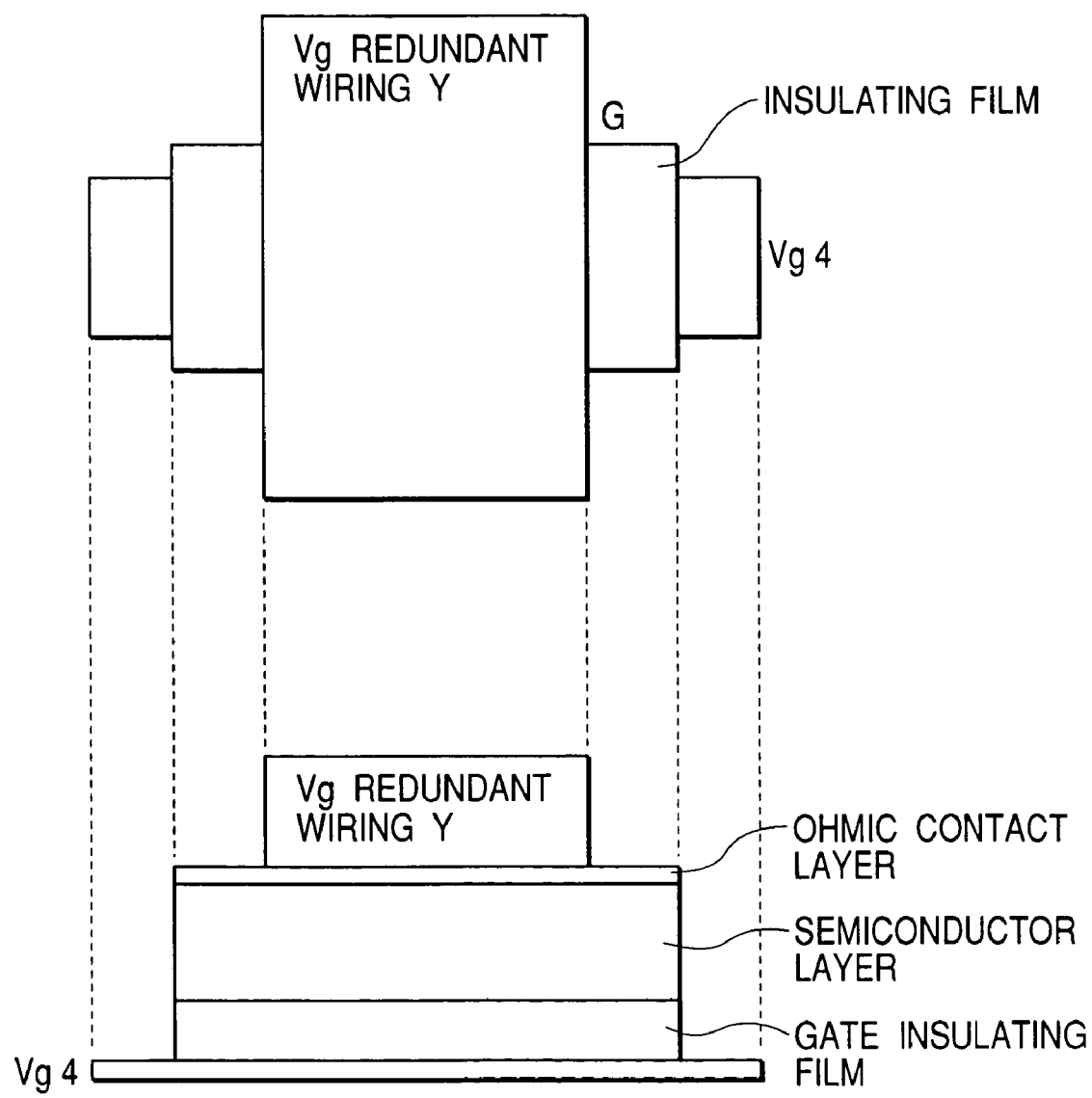
FIG. 3 is an enlarged plan view of a crossing G shown in FIGS. 1 and 2 and a sectional view thereof.
Figure 13:
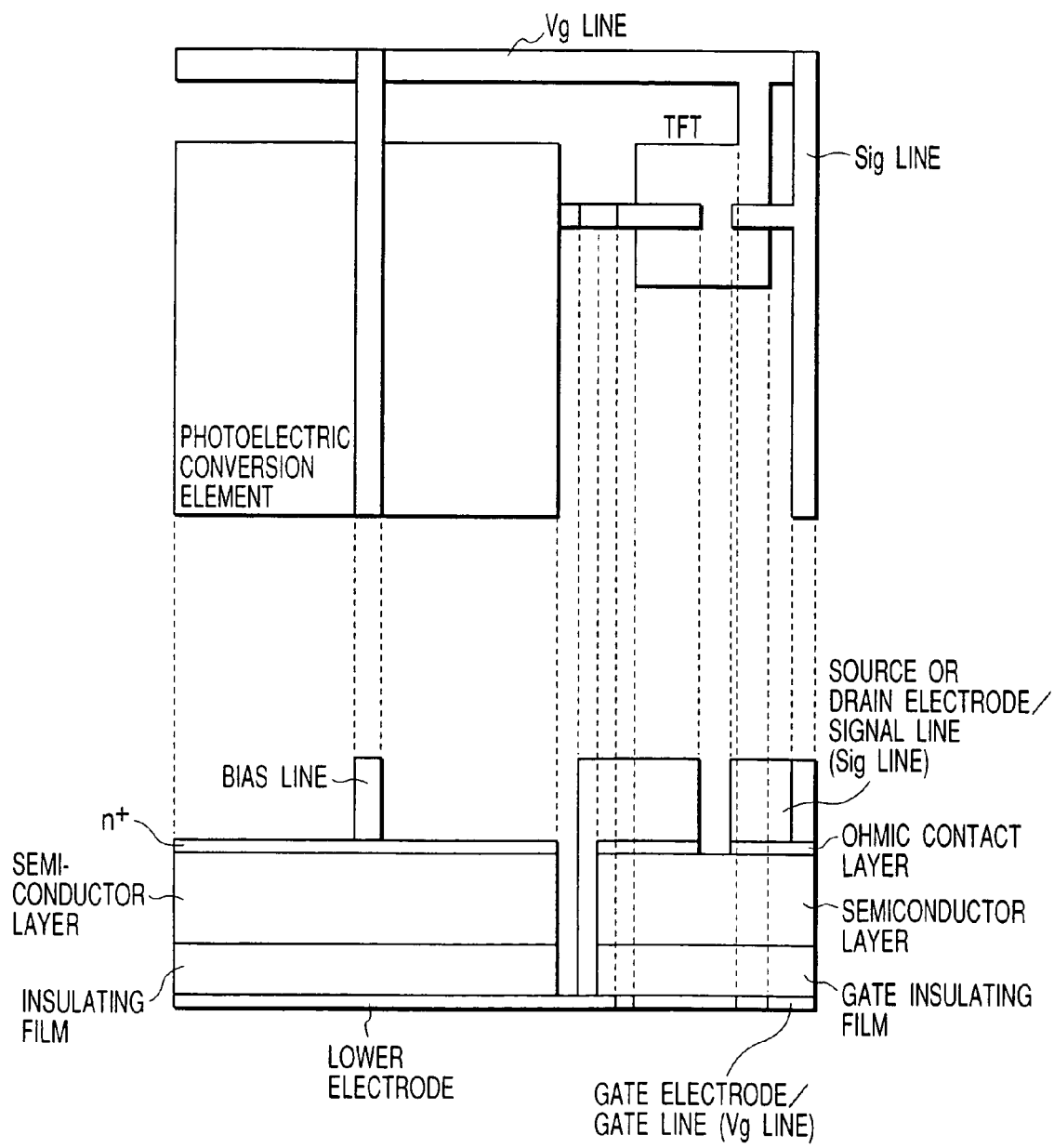
FIG. 13 is a plan view and a sectional view for showing the layer configuration of one pixel of a semiconductor device.

FIG. 3 is an enlarged plan view showing an example of the layer configuration of a crossing G shown in FIGS. 1 and 2 and a sectional view thereof. In FIG. 3, the Vg line and the Vg redundant wiring are electrically insulated from each other and are arranged so as to form a crossing of the upper and lower lines. In the configuration as shown in the figure, if the semiconductor layer has a considerably smaller electric conductivity than the wirings (lines) and the insulation between the redundant wiring and the gate line can be kept with the semiconductor layer retained, the semiconductor layer may be left as it is. Of course, it may be removed if the insulation state can be kept when removed. For example, when the semiconductor device is configured as shown in FIG. 13, the crossings may be formed by adopting the device configuration as such, that is, a stack of an insulating layer, a first semiconductor layer and an $n^+$-type semiconductor layer, a stack of a gate insulating layer, a second semiconductor layer and an ohmic contact layer, or the like, so that the crossings can be formed by a simple process without providing additional steps.

Figure 4:
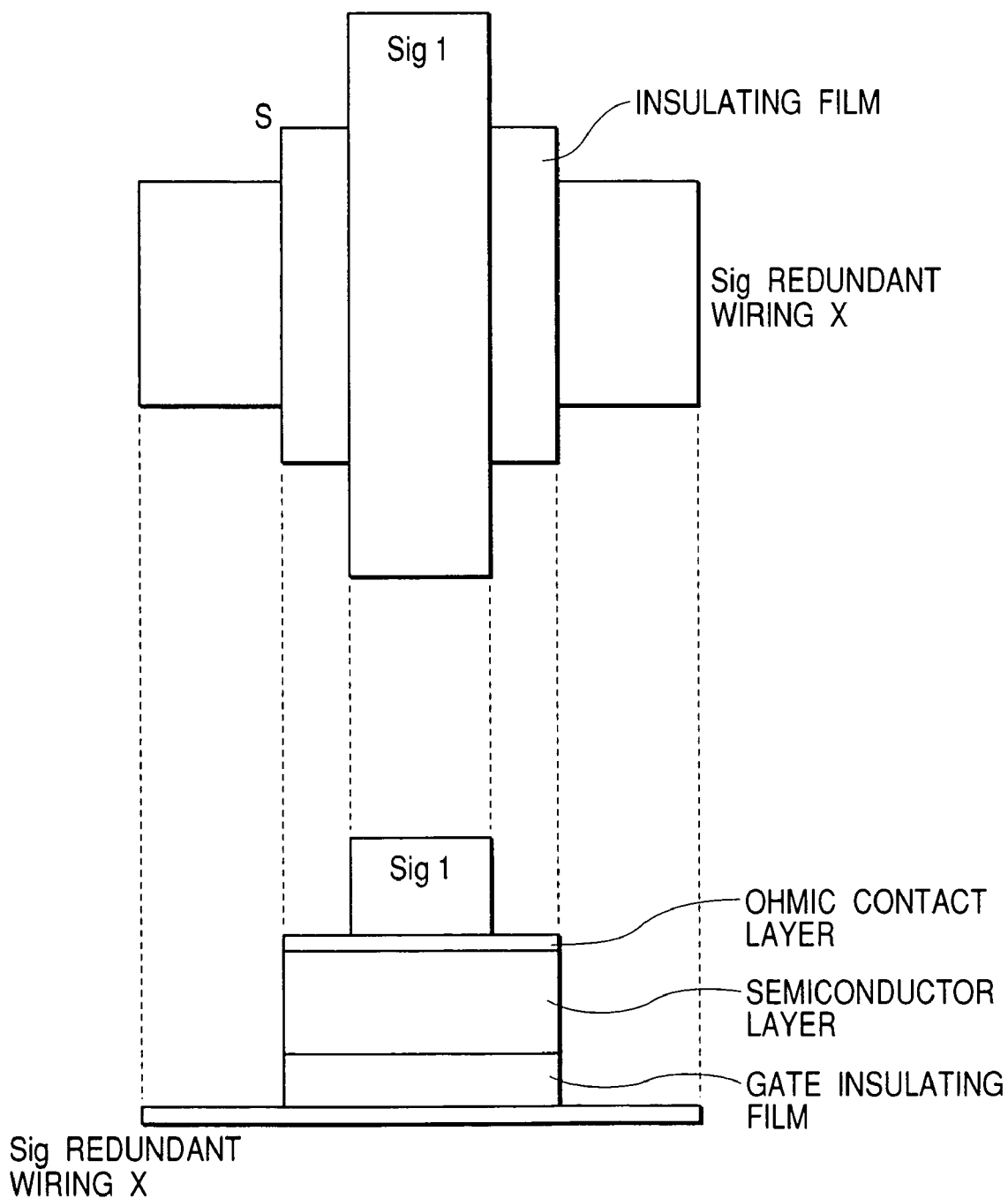
FIG. 4 is an enlarged plan view of a crossing S shown in FIGS. 1 and 2 and a sectional view thereof.

FIG. 4 is an enlarged plan view showing an example of the layer configuration of a crossing S shown in FIGS. 1 and 2 and a sectional view thereof. In FIG. 4, the Sig line and the Sig redundant wiring are electrically insulated from each other and are arranged so as to form a crossing of the upper and lower lines. In the configuration shown in the figure, if the semiconductor layer and the $n^+$-type semiconductor layer each have a considerably smaller electric conductivity than the wirings (lines) and the insulation between the redundant wiring and the gate line can be kept while leaving the layers, the layers may be left as they are. Of course, they may be removed if the insulation state can be kept when removed.

In this embodiment, the Vg redundant wiring X and the Sig redundant wiring X are formed concurrently with the Vg lines and the same insulating film as that for the photoelectric conversion elements is used as an insulating layer therefor and the Vg redundant wiring Y and the Sig redundant wiring Y are formed concurrently with the Sig lines. Therefore, there is no need for additional manufacturing steps to form the redundant wirings.

If a breaking occurs in the gate line Vg4 as shown by the point A in FIGS. 1 and 2, the gate line Vg4 and the Vg redundant wiring are electrically connected to each other by irradiating the crossing G of the gate line Vg4 and the Vg redundant wiring Y with a laser. Thus, gate drive pulses are also applied to the elements T14, T24, T34 on the broken line (gate line Vg4) through the Vg redundant wiring.

Further, if a breaking occurs in the signal line Sig1 as shown by the point B in FIGS. 1 and 2, the signal line Sig1 and the Sig redundant wiring are electrically connected to each other by irradiating the crossing S of the signal line Sig1 and the Sig redundant wiring X with a laser. Thus, an electric charge transferred with the gate drive pulses applied by the gate drive unit to the elements T12, T13, T14 on the broken line (signal line Sig1) is read out by the readout unit through the Sig redundant wiring.

In summary, with the prior art, when a breaking of a line occurs, all the elements connected to the broken line can not be used to lower the yield of the panels, but according to this embodiment, even when a breaking of a line occurs, all the elements connected to the broken line can be used, thereby preventing the lowering in the yield due to breakings of the Vg or Sig lines without any decrease in aperture ratio for the photoelectric conversion elements.

It should be appreciated that the two extra wirings of the Vg redundant wiring and the Sig redundant wiring are provided in this embodiment, but each extra wiring accomplish the same technical effect as mentioned above, so that the number and use of the extra wirings to be provided can be suitably selected depending on the number of possible breakings for each line.

[Embodiment 2]

Figure 5:
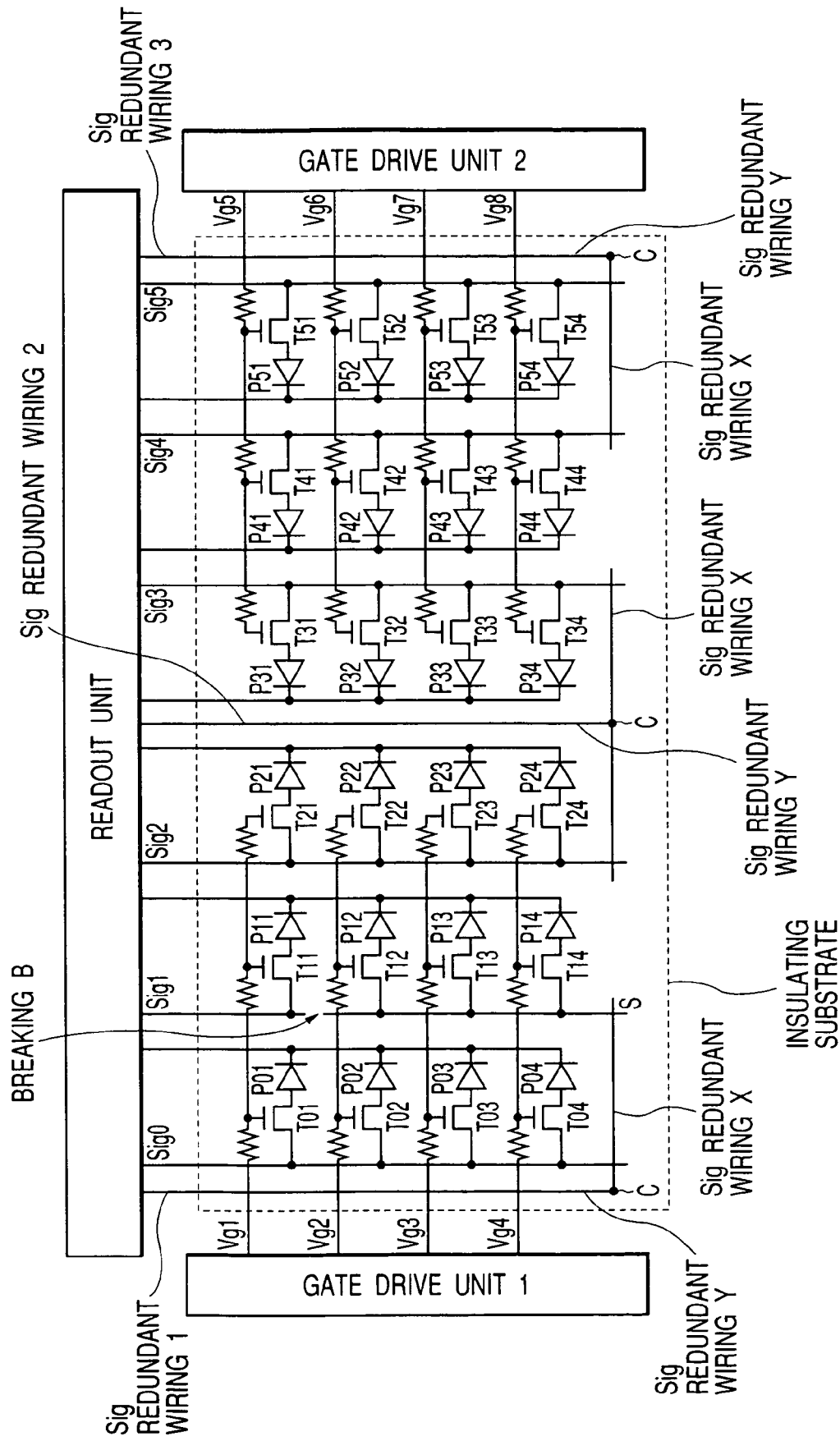
FIG. 5 is an equivalent circuit diagram for showing a second embodiment of the semiconductor device according to the present invention.

FIG. 5 is an equivalent circuit diagram for showing a photoelectric conversion device according to a second embodiment of the present invention.

In FIG. 5, reference numerals P01 to P54 denote semiconductor elements such as photoelectric conversion elements, radiation detection elements or the like and reference numerals T01 to T54 denote switching elements such as TFTs or the like. The gate electrode of each TFT is connected to gate lines Vg1 to Vg4 or Vg5 to Vg8, which are common drive lines. The gate lines Vg1 to Vg4 are connected to a gate drive unit 1 which controls the ON/OFF operations of the TFTs and similarly, the gate lines Vg5 to Vg8 are connected to a gate drive unit 2. The source or drain electrode of each TFT is connected to common signal lines Sig0 to Sig5, which are connected to a readout unit.

Further, three extra wirings are connected to the readout unit. Namely, the extra wirings are Sig redundant wirings 1, 2, 3 to be used as redundant wirings for the Sig lines. The Sig redundant wiring 1 forms crossings with the lines Sig0 and Sig1, the Sig redundant wiring 2 forms crossings with the lines Sig2 and Sig3, and the Sig redundant wiring 3 forms crossings with the lines Sig4 and Sig5 at an end of an insulating substrate, respectively.

Each Sig redundant wiring used herein consists of a Sig redundant wiring X and a Sig redundant wiring Y and they are joined to each other at the point C in the figure. An electric charge generated in the semiconductor elements such as photoelectric conversion elements due to incidence of visible light or radiation is transferred to the signal lines with gate drive pulses applied by the gate drive unit and is then read out by the readout unit.

Each Sig line and a corresponding Sig redundant wiring are electrically insulated from each other and are arranged so as to form a crossing of the upper and lower lines.

If a breaking occurs in the signal line Sig1 as shown by the point B in the figure, the signal line Sig1 and the Sig redundant wiring 1 are electrically connected to each other by irradiating the crossing S of the signal line Sig1 and the Sig redundant wiring 1 with a laser. Thus, an electric charge transferred with the gate drive pulses applied by the gate drive unit to the elements T12, T13, T14 on the broken line (signal line Sig1) are read out by the readout unit through the Sig redundant wiring 1.

Therefore, the lowering in the yield due to breakings in the Sig lines can be prevented. In addition, the lowering in the yield due to a plurality of breakings can be also prevented by forming a plurality of redundant wirings as in this embodiment.

It should be appreciated that the extra wirings are connected to the readout unit in this embodiment, but the number and use of the extra wirings can be suitably selected depending on the number of possible breakings in each line, for example, the extra wirings may be connected to the gate drive unit so as to provide Vg redundant wirings when a plurality of breakings occur in the Vg lines.

[Embodiment 3]

Figure 6:
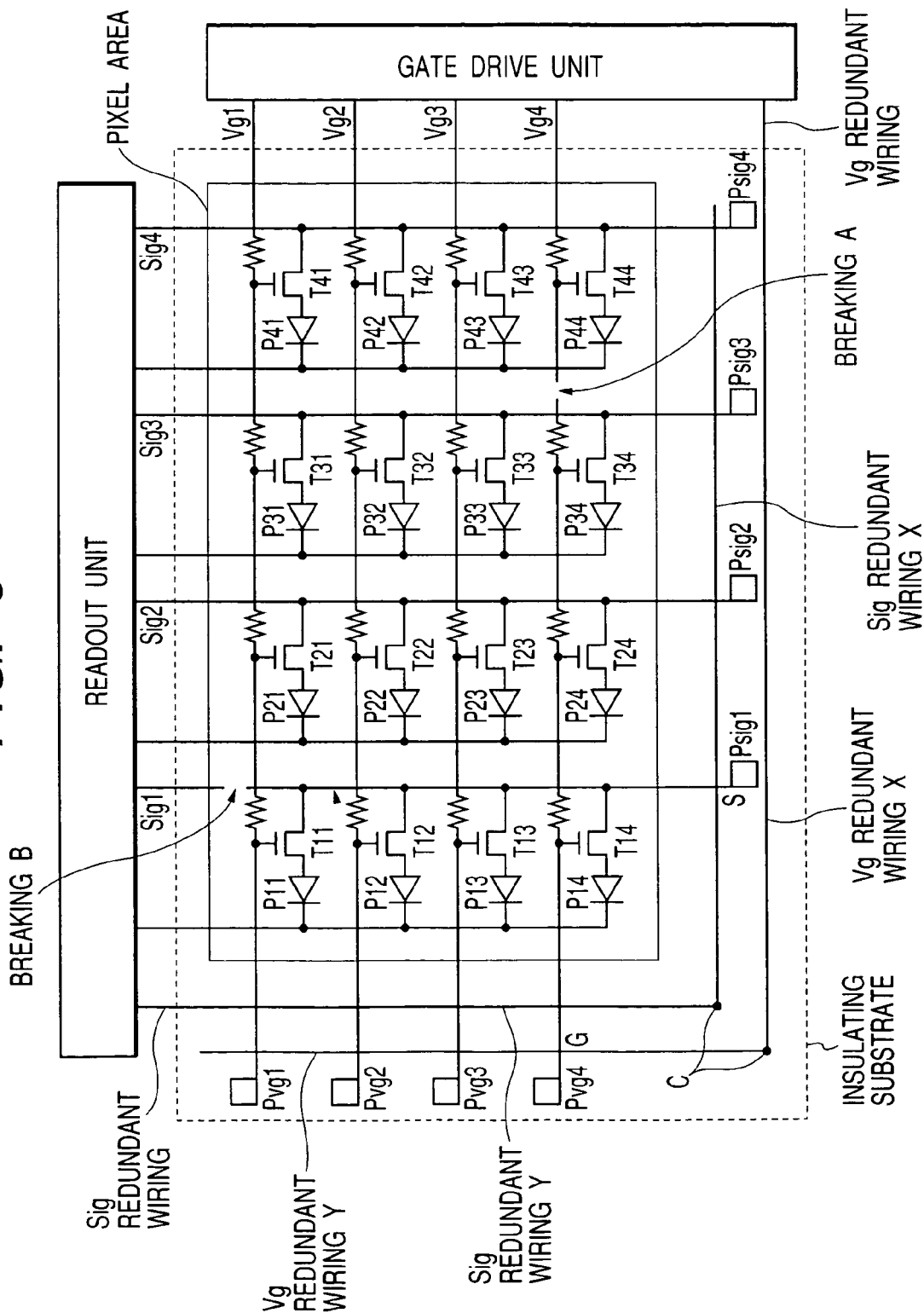
FIG. 6 is an equivalent circuit diagram for showing a third embodiment of the semiconductor device according to the present invention.

FIG. 6 is an equivalent circuit diagram for showing a photoelectric conversion device according to a third embodiment of the present invention.

In FIG. 6, reference numerals P11 to P44 denote semiconductor elements such as photoelectric conversion elements, radiation detection elements or the like and reference numerals T11 to T44 denote switching elements such as TFTs or the like. The gate electrode of each TFT is connected to gate lines Vg1 to Vg4 which are common drive lines. The gate lines Vg1 to Vg4 are connected to a gate drive unit which controls the ON/OFF operations of the TFTs. The source or drain electrode of each TFT is connected to common signal lines Sig1 to Sig4, which are connected to a readout unit.

In addition, an extra wiring (Vg redundant wiring) connected to the gate drive unit acts as a redundant wiring for the Vg lines and forms a crossing with each Vg line outside a pixel area. Another extra wiring (Sig redundant wiring) connected to the readout unit acts as a redundant wiring for the Sig lines and forms a crossing with each Sig line outside the pixel area.

The Vg redundant wiring used herein consists of a Vg redundant wiring X and a Vg redundant wiring Y and they are joined to each other at the point C in the figure. The Sig redundant wiring used herein consists of a Sig redundant wiring X and a Sig redundant wiring Y and they are joined to each other at the point C in the figure.

An electric charge generated in the semiconductor elements such as photoelectric conversion elements due to incidence of visible light or radiation is transferred to the signal lines with gate drive pulses applied by the gate drive unit and is then read out by the readout unit.

Each Vg line and the Vg redundant wiring are electrically insulated from each other and are arranged so as to form a crossing of the upper and lower lines. Also, each Sig line and the Sig redundant wiring are electrically insulated from each other and are arranged so as to form a crossing of the upper and lower lines.

If a breaking occurs in the gate line Vg4 as shown by the point A in the figure, applying a voltage between a pad Pvg4 for the gate line Vg4 and the Vg redundant wiring destroys an insulating film existing between the gate line Vg4 and the Vg redundant wiring to effect electrical connection at the crossing G. Thus, gate drive pulses are also applied to the elements T14, T24, T34 on the broken line (gate line Vg4) through the Vg redundant wiring.

If a breaking occurs in the signal line Sig1 as shown by the point B in the figure, applying a voltage between a pad Psig1 for the signal line Sig1 and the Sig redundant wiring destroys an insulating layer to electrically connect the signal line Sig1 and the Sig redundant wiring at the crossing S. Thus, an electric charge transferred with the gate drive pulses applied by the gate drive unit to the elements T11, T12, T13, T14 on the broken line (signal line Sig1) are read out by the readout unit through the Sig redundant wiring.

In summary, providing a pad and applying a voltage thereto breaks insulation between a redundant wiring and a drive line and/or a signal line to effect electrical connection with the redundant wiring. When such a pad is provided, the pad can be used to inspect for broken lines, and after the inspection, electrical breakdown may be produced by applying a voltage higher than that for the inspection. Therefore, the configuration of this embodiment can prevent the lowering in the yield due to breakings in the Vg or Sig lines. In addition, with this embodiment, since the extra wirings are arranged outside the pixel area, the aperture ratio for the photoelectric conversion elements will not be reduced.

It should be appreciated that the two extra wirings of the Vg redundant wiring and the Sig redundant wiring are provided in this embodiment, but each extra wiring accomplish the same technical effect as mentioned above, so that the number and use of the extra wirings to be provided can be suitably selected depending on the number of possible breakings for each line.

[Embodiment 4]

Figure 7:
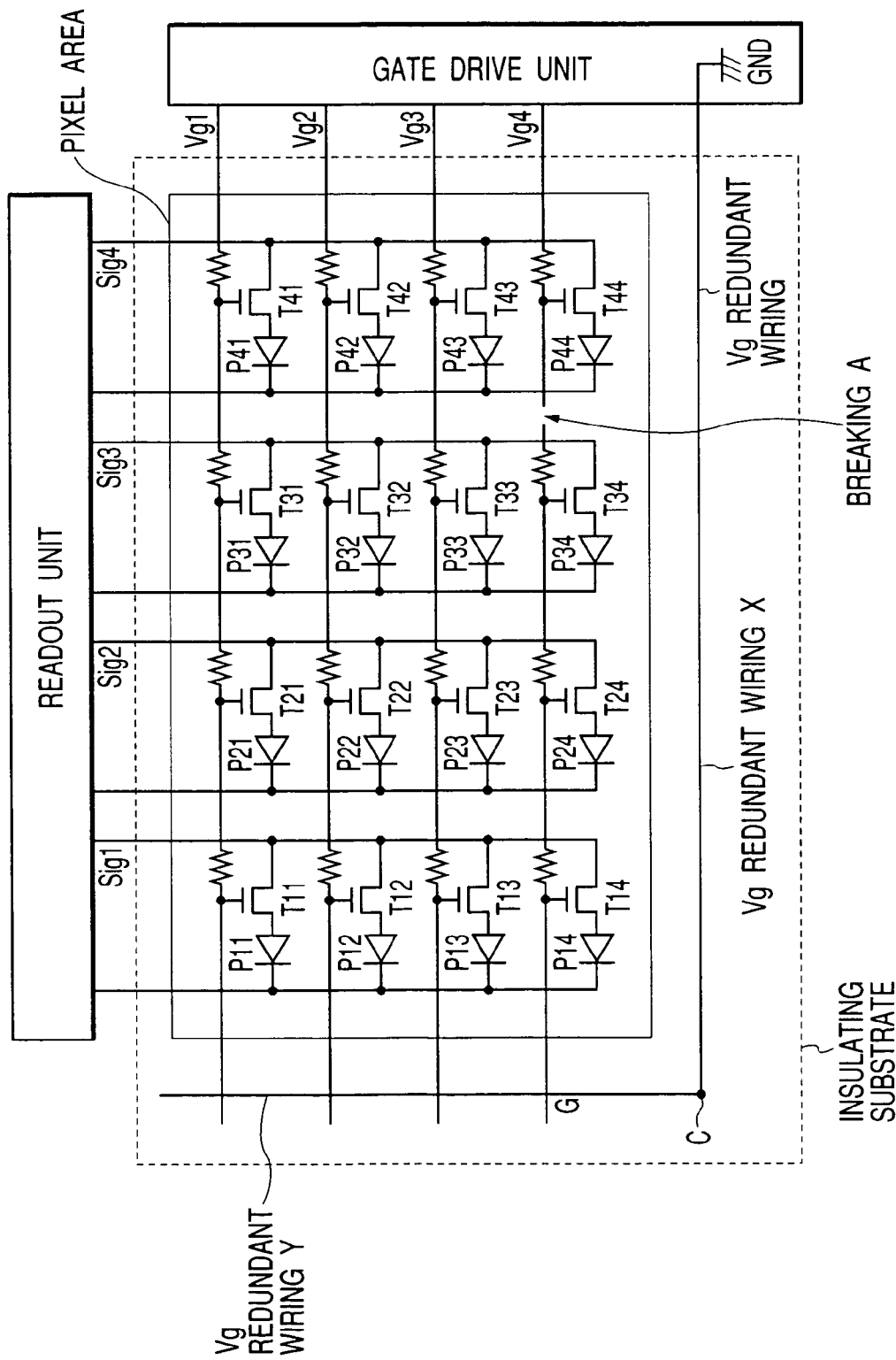
FIG. 7 is an equivalent circuit diagram for showing a fourth embodiment of the semiconductor device according to the present invention.

FIG. 7 is an equivalent circuit diagram for showing a photoelectric conversion device according to a fourth embodiment of the present invention.

In FIG. 7, reference numerals P11 to P44 denote semiconductor elements such as photoelectric conversion elements, radiation detection elements or the like and reference numerals T11 to T44 denote switching elements such as TFTs or the like. The gate electrode of each TFT is connected to gate lines Vg1 to Vg4 which are common drive lines. The gate lines Vg1 to Vg4 are connected to a gate drive unit which controls the ON/OFF operations of the TFTs. The source or drain electrode of each TFT is connected to common signal lines Sig1 to Sig4, which are connected to a readout unit.

Further, an extra wiring (Vg redundant wiring) is connected to a reference potential (for example, GND) to act as a redundant wiring for the Vg lines and forms a crossing with each Vg line outside a pixel area.

The Vg redundant wiring used herein consists of a Vg redundant wiring X and a Vg redundant wiring Y and they are joined to each other at the point C in the figure.

A electric charge generated in the semiconductor elements such as photoelectric conversion elements, radiation detection elements or the like due to incidence of visible light or radiation is transferred to the signal lines with gate drive pulses applied by the gate drive unit and is then read out by the readout unit.

Each Vg line and the Vg redundant wiring are electrically insulated from each other and are arranged so as to form a crossing of the upper and lower lines.

If a breaking occurs in the gate line Vg4 as shown by the point A, a crossing G of the gate line Vg4 and the Vg redundant wiring is irradiated with a laser to electrically connect the gate line Vg4 and the Vg redundant wiring to each other. Thus, the potential of the elements T14, T24, T34 on the broken line (gate line Vg4) can be fixed to prevent the potential of the broken line (gate line Vg4) from becoming unstable to adversely affect the pixels associated therewith.

In addition, in this embodiment, since the extra wiring is arranged outside the pixel area, the aperture ratio for the photoelectric conversion elements will not be reduced. As the method of effecting electrical connection at the crossing G, there may also be used the method of applying a voltage to destroy an insulating film as described in the third embodiment.

It should be appreciated that the single extra wiring, that is, the Vg redundant wiring is provided in this embodiment, but the number and use of extra wirings can be suitably selected depending on the number of possible breakings in each wire, for example, a single Sig redundant wiring may be provided or two extra wirings may be provided with one as a Vg redundant wiring and the other as a Sig redundant wiring.

[Embodiment 5]

Figure 8:
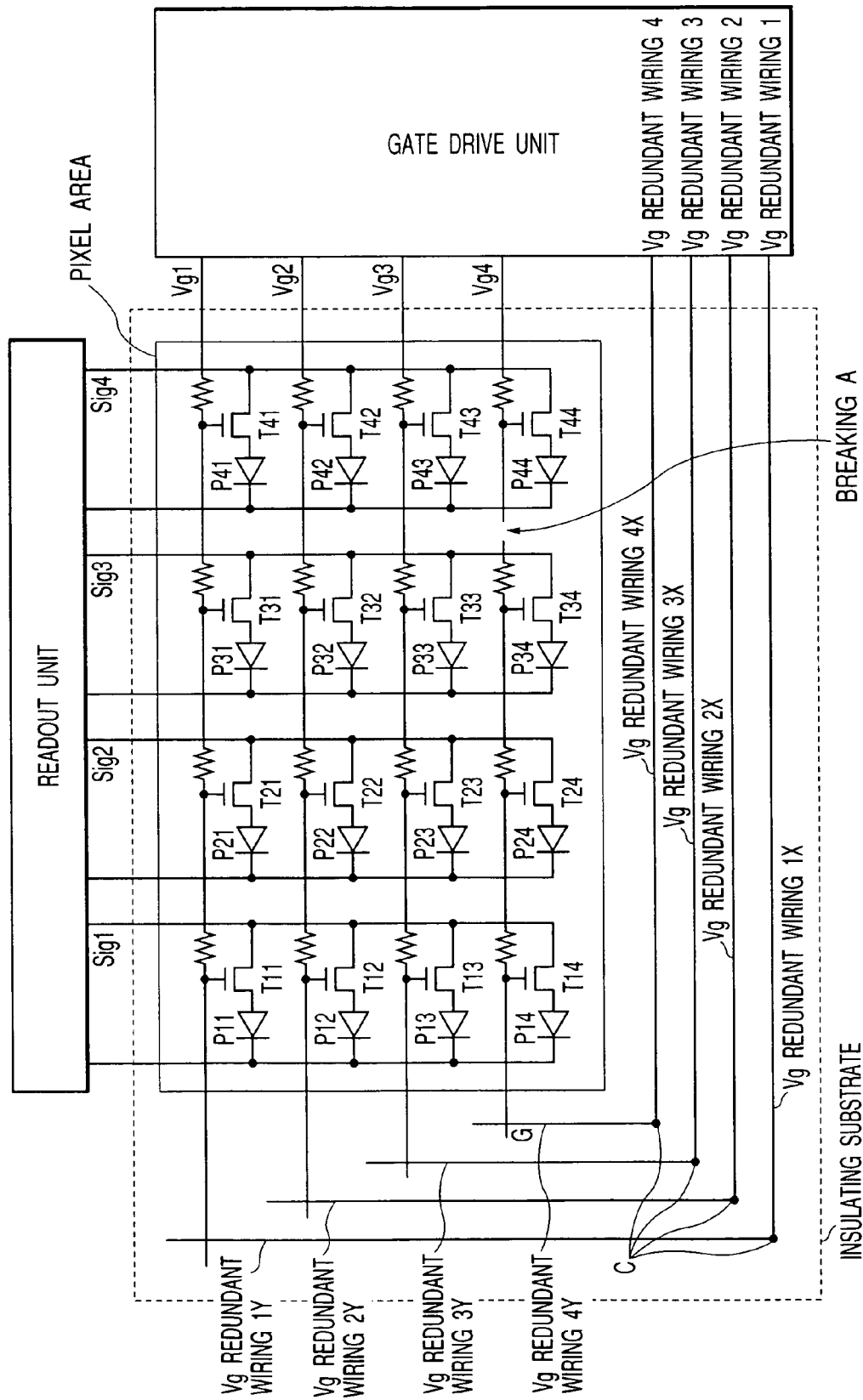
FIG. 8 is an equivalent circuit diagram for showing a fifth embodiment of the semiconductor device according to the present invention.

FIG. 8 is an equivalent circuit diagram for showing a photoelectric conversion device according to a fifth embodiment of the present invention.

In FIG. 8, reference numerals P11 to P44 denote semiconductor elements such as photoelectric conversion elements, radiation detection elements or the like and reference numerals T11 to T44 denote switching elements such as TFTs or the like. The gate electrode of each TFT is connected to gate lines Vg1 to Vg4 which are common drive lines. The gate lines Vg1 to Vg4 are connected to a gate drive unit which controls the ON/OFF operations of the TFTs. The source or drain electrode of each TFT is connected to common signal lines Sig1 to Sig4, which are connected to a readout unit.

Further, there exist a plurality of (in this case, four) extra wirings (Vg redundant wirings) connected to a gate drive unit, each of which acts as a redundant wiring for the Vg lines and forms a crossing with each Vg line at an end of an insulating substrate.

Each Vg redundant wiring used herein consists of a Vg redundant wiring X and a Vg redundant wiring Y and they are joined to each other at the point C in the figure.

An electric charge generated in the semiconductor elements such as photoelectric conversion elements, radiation detection elements or the like due to incidence of visible light or radiation is transferred to the signal lines with gate drive pulses applied by the gate drive unit and is then read out by the readout unit.

Each Vg line and one Vg redundant wiring corresponding thereto are electrically insulated from each other and are arranged so as to form a crossing of the upper and lower lines.

If a breaking occurs in the gate line Vg4 as shown by the point A, the crossing G of the gate line Vg4 and the Vg redundant wiring 4 is irradiated with a laser to electrically connect the gate line Vg4 and the Vg redundant wiring 4 to each other. Thus, gate drive pulses are also applied to the elements T14, T24, T34 on the broken line (gate line Vg4) through the Vg redundant wiring 4. Therefore, the lowering in the yield due to breakings of lines can be prevented.

Further, as the method of effecting electrical connection at the crossing G, there may also be used the method of applying a voltage to destroy an insulating film as described in the third embodiment.

It should be appreciated that the four extra wirings, that is, the four Vg redundant wirings are provided in this embodiment, but the number and use of extra wirings can be suitably selected depending on the number of possible breakings in each wire, for example, Sig redundant wirings may be provided.

[Embodiment 6]

Figure 9:
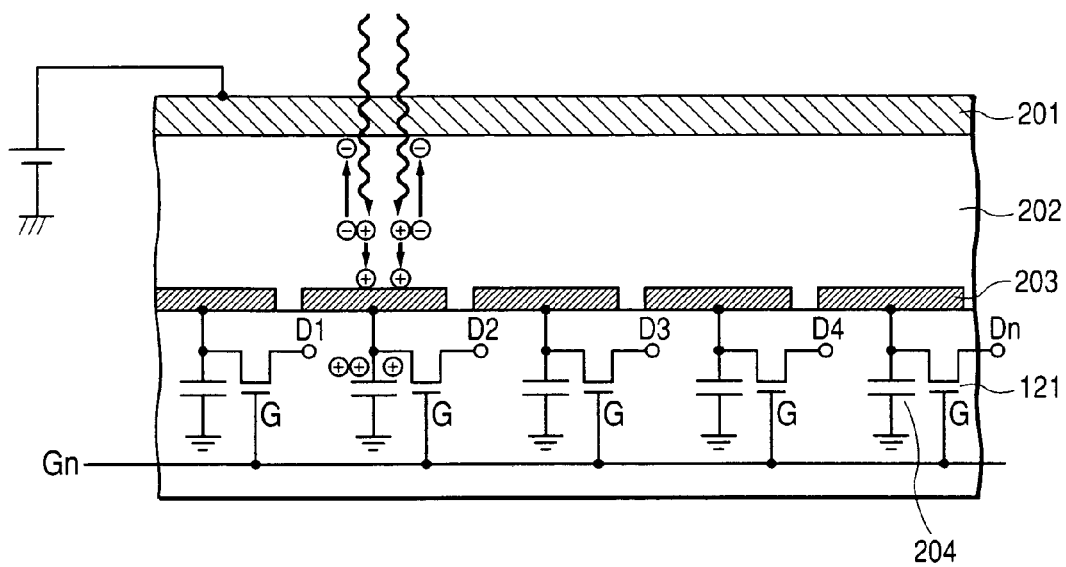
FIG. 9 is a schematic sectional view for showing an embodiment of the radiation detection device according to the present invention.
Figure 10:
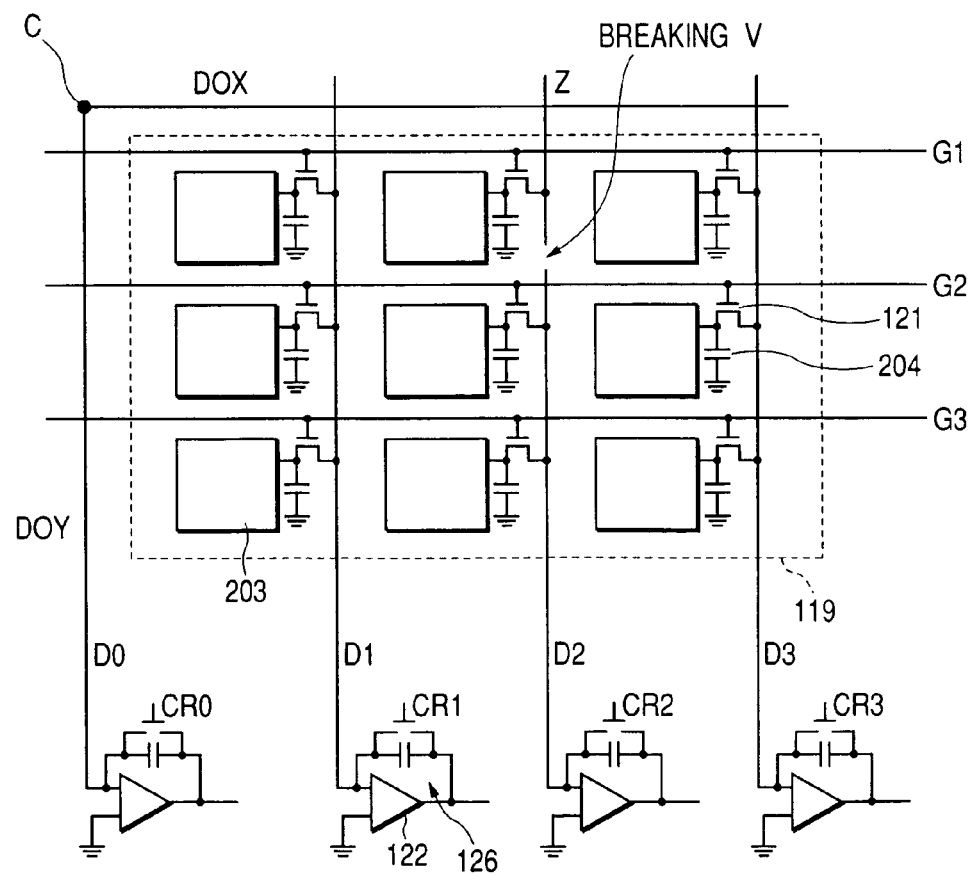
FIG. 10 is a schematic plan view for showing the embodiment of the radiation detection device according to the present invention.
Figure 11:
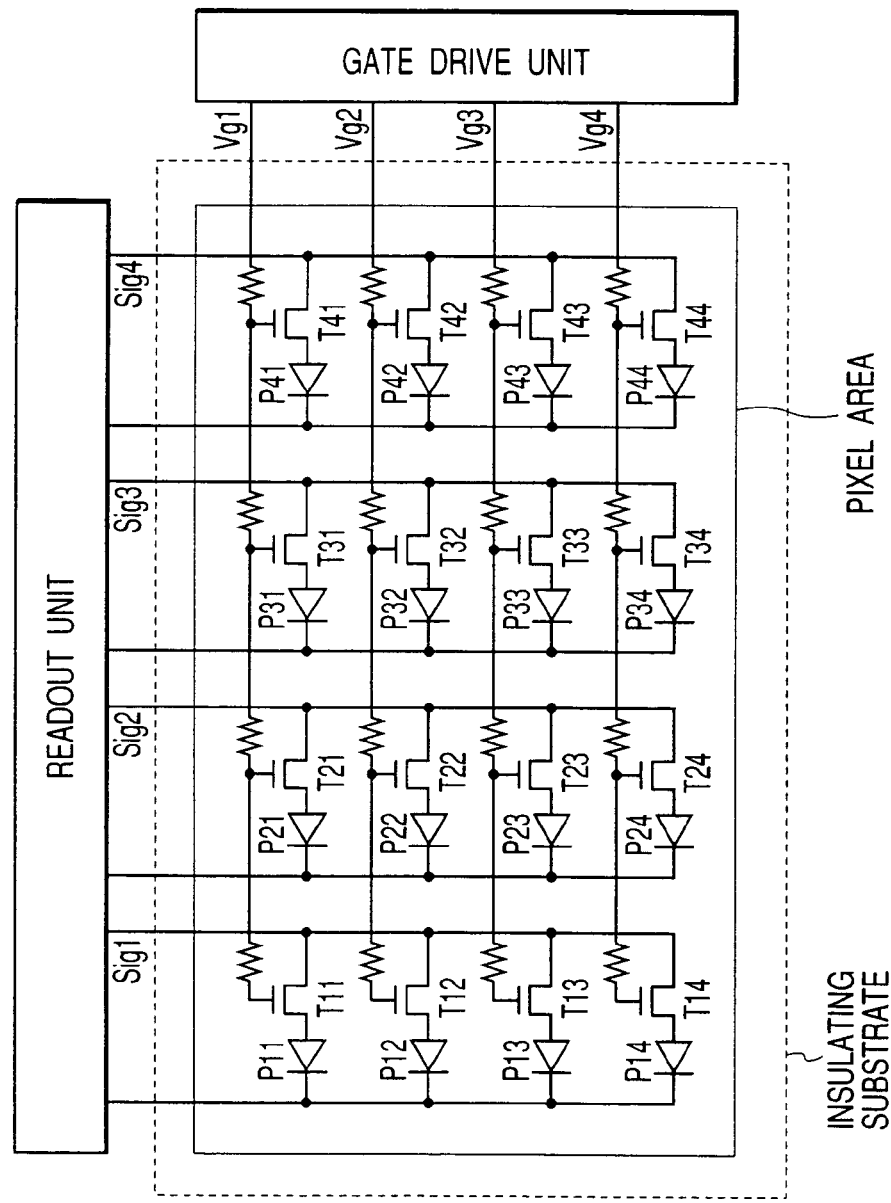
FIG. 11 is an equivalent circuit diagram of a prior art photoelectric conversion device.
Figure 12:
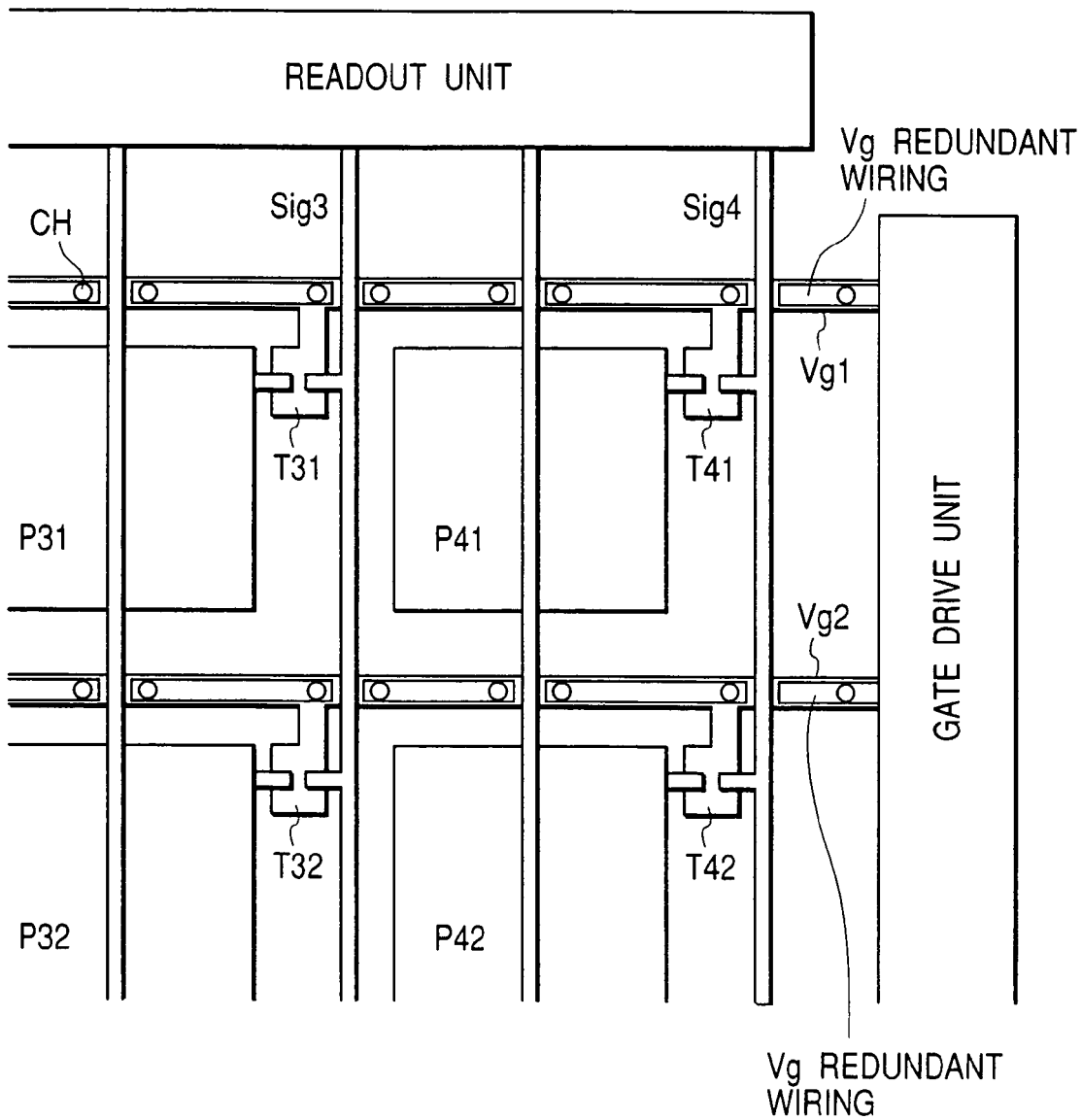
FIG. 12 is a plan view of the photoelectric conversion device shown in FIG. 11.

FIG. 9 is a schematic sectional view for showing a radiation detection device according to a sixth embodiment of the present invention. FIG. 10 is a plan view of the device shown in FIG. 9. The radiation detection device of this embodiment has an energy converter that converts a radiation directly into an electric charge, such as amorphous selenium (a-Se), GaAs or the like.

FIG. 9 shows a common electrode 201, an electric charge collecting electrode 203 for collecting an electric charge converted by an energy converter 202, storage capacitors 204 for storing the electric charge collected by the electric charge collecting electrode 203, and switching element TFTs 121 for controlling the readout of the electric charge stored by the storage capacitors 204. In this device, a plurality of pixels are formed by dividing the electric charge collecting electrode 203 into a plurality of sections.

FIG. 10 shows a pixel area 119 having a plurality sets of an electric charge collecting electrode 203 and other components, integrating circuits 126 having amplifiers 122 for amplifying the electric charge read out from the pixel area 119 and capacitors CR0 to CR3, data signal lines D0 to D3 for connecting the pixel area 119 and the integrating circuits 126 to each other, and gate drive lines G1 to G3 connected to the gate terminals of the TFTs 121. Here, the line D0 is an extra wiring, that is, a redundant wiring which consists of lines D0X and D0Y, and the lines D0X and D0Y are arranged in superposition with an insulating film therebetween and are connected to each other at the point C in the figure. The line D0 is also in superposition to and has crossings with the data signal lines D1 to D3 outside the pixel area and each crossing is electrically insulated.

If a breaking occurs in the line D2 as shown by the point V in FIG. 10, the crossing Z is irradiated with a laser to electrically connect the lines D2 and D0 to each other, thereby enabling readout of an electric charge through the broken line. Therefore, the lowering in the yield due to breakings of data signal lines can be prevented. If the energy converter 202 has a small electric conductivity, the crossings may be formed with the energy converter 202 unremoved, so that additional process steps to remove the semiconductor layer of the energy converter 202 can be omitted.

It should be appreciated that this embodiment is configured so as to connect the extra wiring, that is, the redundant wiring to the data signal lines but it may be configured so as to connect the extra wiring to the gate drive lines or, of course, to combine the both connecting manners.

[Embodiment 7]

Next, an implementation of the radiation detection device which uses the semiconductor device according to the present invention to detect a radiation such as X-ray, etc. and a radiation imaging system having the radiation detection device will be described below. As an example of the radiation imaging system, the case of an X-ray diagnostic system will be taken.

Figure 14A:
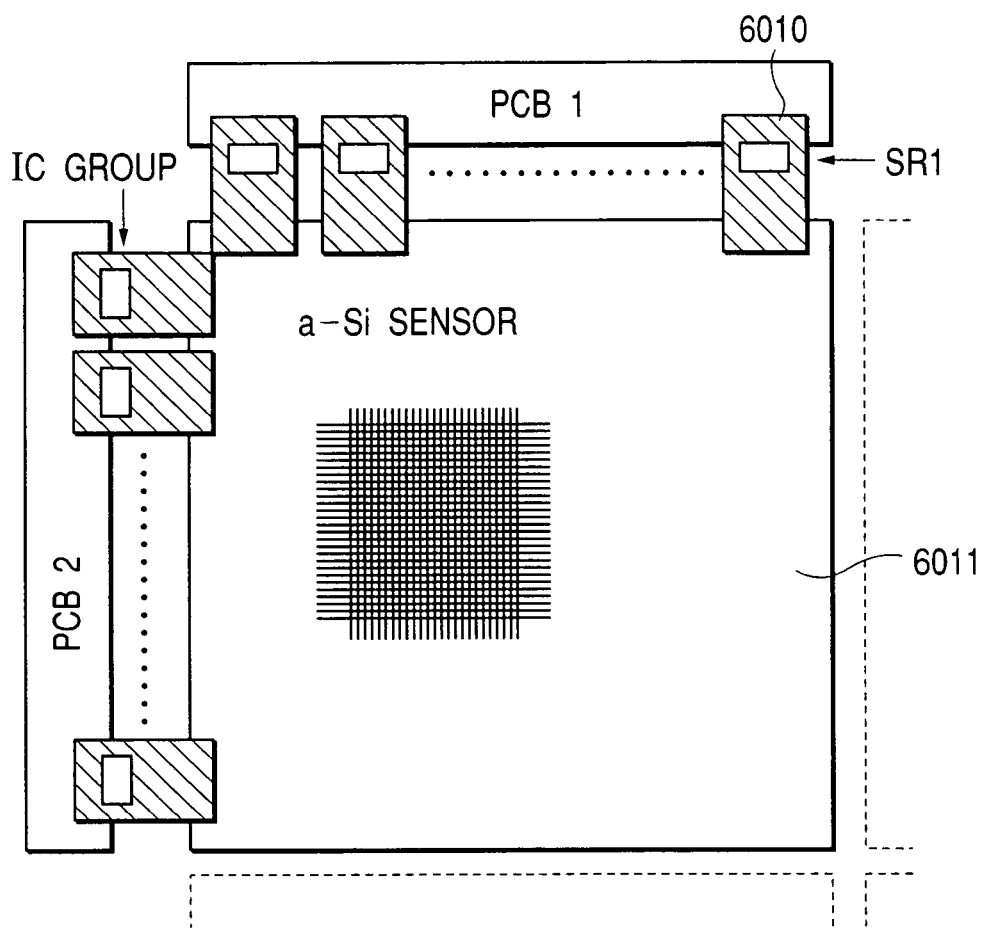
FIGS. 14A and 14B are a schematic block diagram and a schematic sectional view for showing an example of the radiation detection device to which the present invention is applied, respectively.
Figure 14B:
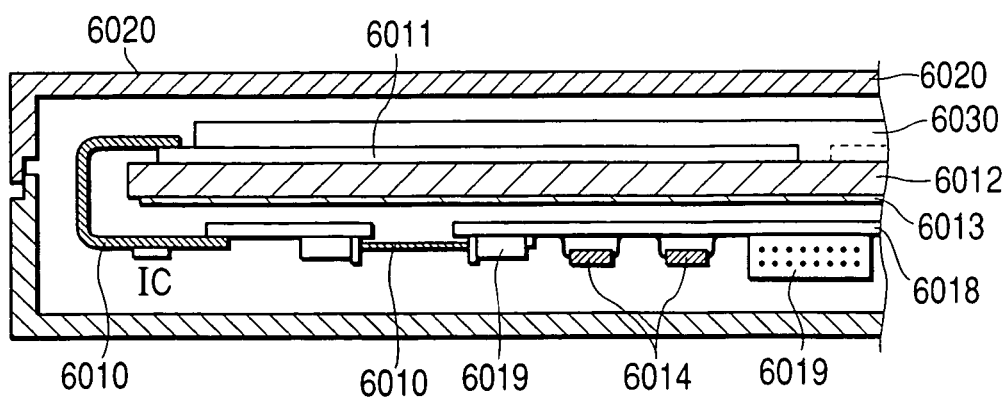

FIGS. 14A and 14B are a schematic block diagram and a schematic sectional view for showing an implementation of the radiation detection device to detect a radiation such as X-ray comprised of a phosphor bonded to the semiconductor device according to the present invention.

A plurality of photoelectric conversion elements or radiation detection elements and switching elements such as TFTs are formed in each a-Si (amorphous silicon) sensor substrate 6011, to which flexible circuit boards 6010 having shift registers SR1 and integrated circuits IC for detection mounted thereon are connected. The sides of the flexible circuit boards 6010 opposite to the a-Si substrate are connected to the circuit boards PCB1, PCB2. A plurality of the a-Si sensor substrates 6011 are bonded on the upper surface of the base 6012 and a lead sheet 6013 for protecting memories 6014 in processing unit 6018 from X-rays is mounted on the bottom of the base 6012 forming the large photodetecting device. On the a-Si sensor substrate 6011 is vapor deposited a phosphor 6030 as a wavelength converter such as CsI for converting an incident radiation to visible light. Here, if a semiconductor material which is directly sensitive to a radiation is used, it is not necessary to provide the wavelength converter such as a phosphor or the like. In this embodiment, the whole device is housed in a case 6020 made of carbon fiber, as illustrated in FIG. 14B.

Figure 15:
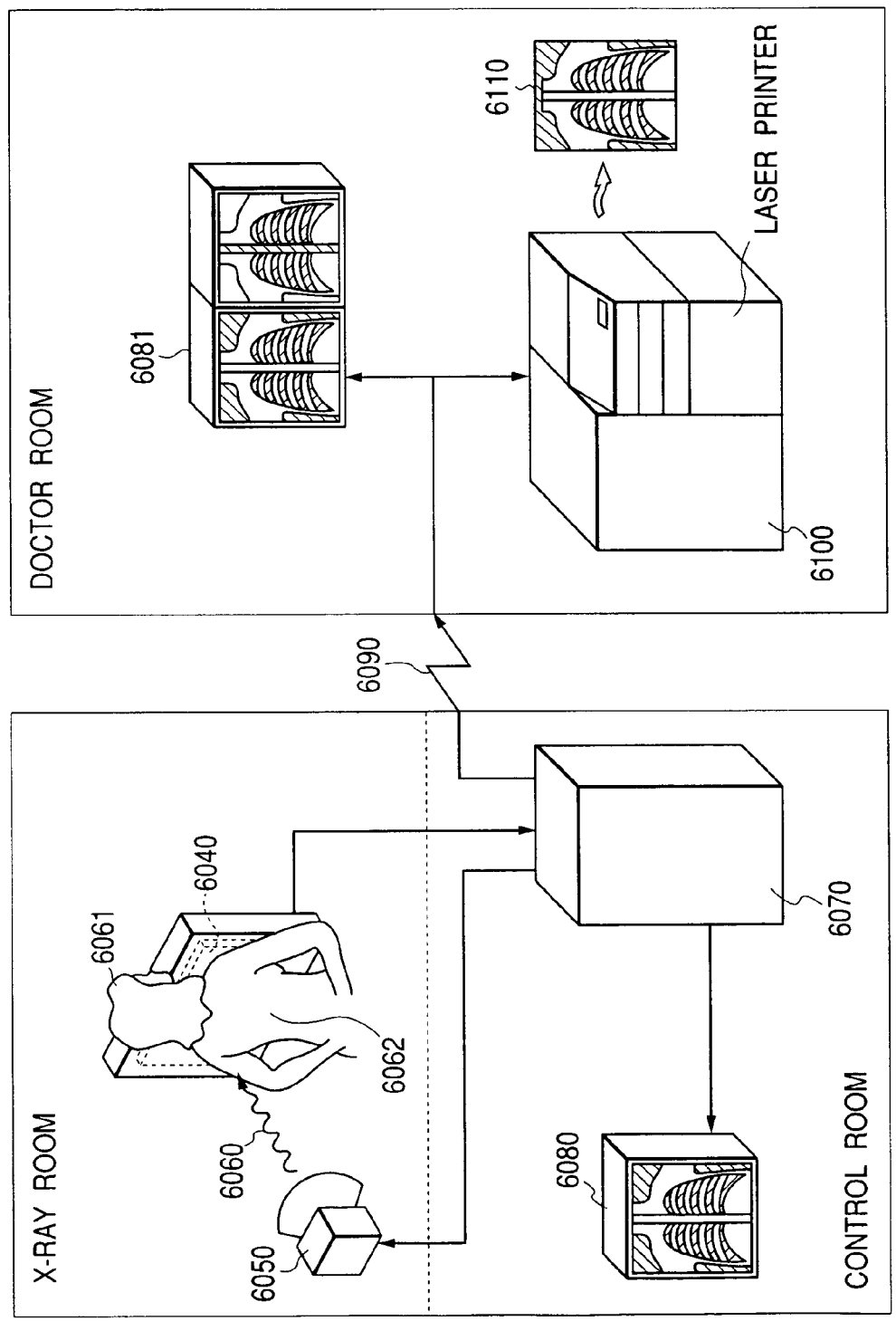
FIG. 15 is a system block diagram for showing an example of the radiation detection system according to the present invention.

FIG. 15 shows application of the above described radiation detection device to an X-ray diagnostic system.

FIG. 15 is a view showing an example of an X-ray diagnostic system provided with the above information reading apparatus.

X-rays 6060 generated in an X-ray tube 6050 pass through the chest part 6062 of a patient or subject 6061 and is then incident on the photodetecting device 6040. The incident X-rays contain an internal information of the body of the patient or subject 6061. In correspondence to the incidence of X-rays the phosphor emits light, which is photoelectrically converted to provide an electrical information such as an electric charge. The information is converted to a digital signal, which is picture-processed in a picture processor 6070 to be observed on a display 6080 in a control room.

In addition, the information can be transferred to a remote location through transmission means such as a telephone line 6090 and can be displayed on a display 6081 in a doctor room or the like at a different location or can be stored in storage means such as optical disks to allow for diagnosis by a doctor at a remote location. Further, the information can be recorded on a film 6110 by a film processor 6100.

It should be appreciated that the term "radiation" used herein refers to X rays, $\alpha$ rays, $\beta$ rays, or $\gamma$ rays and the term "light" refers to electromagnetic waves within a range of wavelengths which can be detected by a photoelectric conversion element and includes visible light.

What is claimed is:

1. A semiconductor device comprising:
   an insulating substrate;
   a plurality of semiconductor conversion elements provided on the insulating substrate, for converting an energy to an electric charge;
   a plurality of switching elements, the plurality of switching elements and the plurality of semiconductor conversion elements constituting a pixel area;
   a plurality of drive lines for supplying a drive signal to the switching elements;
   a plurality of signal lines for reading out the electric charge converted by the semiconductor conversion elements; and
   at least one redundant drive wiring for driving the switching elements and at least one redundant signal wiring line for reading out the electric charge, the redundant drive wiring and a said drive line, and the redundant signal wiring and a said signal line, each form outside of the pixel area a crossing in an electrically insulated state,
   wherein the redundant wirings comprise a first wiring formed concurrently with the drive line and a second wiring formed concurrently with the signal line, and the first and second wirings are joined to each other through a contact hole.

2. The device according to claim 1, wherein a broken drive line and the redundant wiring are electrically connected by irradiating the crossing with a laser.

3. The device according to claim 1, comprising a pad on at least one of the drive lines and the signal lines.

4. The device according to claim 1 wherein a broken drive line and the redundant wiring are electrically connected by applying a voltage therebetween.

5. The device according to claim 1, wherein the redundant wiring is connected to a reference potential.

6. The device according to claim 5 wherein the reference potential is a ground potential.

7. The device according to claim 1, wherein the electrical connection is effected in the crossing to fix the potential of a broken drive line.

8. The device according to claim 1 wherein a semiconductor layer is formed between the drive lines and the redundant wiring or between the signal lines and the redundant wiring, at the crossings.

9. The semiconductor device according to claim 1 wherein the semiconductor conversion element comprises a first electrode layer, an insulating layer, a first semiconductor layer, an $n^+$-type semiconductor layer, and a second electrode layer, and a switching TFT comprised of a gate electrode layer, a gate insulating layer, a second semiconductor layer, and an ohmic contact layer, wherein the redundant wiring forms a plurality of crossings with at least one of the drive line and the crossings are each comprised of the insulating layer, the first semiconductor layer and the $n^+$-type semiconductor layer or the gate insulating layer, the second semiconductor layer and the ohmic contact layer.

10. The semiconductor device according to claim 1, wherein the semiconductor conversion element converts a light into an electric charge.

11. The semiconductor device according to claim 10, further comprising a wavelength converter for converting a radiation into the light.

12. A radiation imaging system comprising:
the semiconductor device as set forth in claim 11;
signal processing means for processing a signal from the semiconductor device;
recording means for recording a signal from the signal processing means;
display means for displaying a signal from the signal processing means;
transmission processing means for transmitting a signal from the signal processing means; and
a radiation source for generating the radiation.

13. The semiconductor device according to claim 1 wherein the semiconductor conversion element converts a radiation directly into an electric charge.

14. The semiconductor device according to claim 13, wherein the semiconductor conversion element comprises amorphous selenium or GaAs.

* * * * *

UNITED STATES PATENT AND TRADEMARK OFFICE
CERTIFICATE OF CORRECTION

| | |
|---|---|
| PATENT NO. | : 6,995,373 B2 |
| APPLICATION NO. | : 11/071245 |
| DATED | : February 7, 2006 |
| INVENTOR(S) | : Takamasa Ishii et al. |

It is certified that error appears in the above-identified patent and that said Letters Patent is hereby corrected as shown below:

COLUMN 3

Line 57, "A" should read --An--.

COLUMN 4

Line 67, "plish" should read --plishes--.

COLUMN 6

Line 67, "plish" should read --plishes--.

COLUMN 7

Line 26, "A" should read --An--.

COLUMN 8

Line 61, "plurality" should read --plurality of--.

COLUMN 9

Line 65, "is" should read --are--.

COLUMN 10

Line 36, "a" should read --at a--;
    Line 48, "claim 1" should read --claim 1,--;
    Line 53, "claim 5" should read --claim 5,--;
    Line 58, "claim 1" should read --claim 1,--; and
    Line 62, "claim 1" should read --claim 1,--.

COLUMN 11

Line 3, "line" should read --lines--.

UNITED STATES PATENT AND TRADEMARK OFFICE
CERTIFICATE OF CORRECTION

PATENT NO. : 6,995,373 B2
APPLICATION NO. : 11/071245
DATED : February 7, 2006
INVENTOR(S) : Takamasa Ishii et al.

It is certified that error appears in the above-identified patent and that said Letters Patent is hereby corrected as shown below:

COLUMN 12

Line 8, "claim 1" should read --claim 1,--.

Signed and Sealed this

Twenty-third Day of September, 2008

JON W. DUDAS
*Director of the United States Patent and Trademark Office*